United States Patent [19]

Homola et al.

[11] 4,298,882
[45] Nov. 3, 1981

[54] MULTILAYER SEMICONDUCTOR ELEMENT

[75] Inventors: Jaroslav Homola, Kladno; Karel Remajzl; Milan Prokes, both of Prague, all of Czechoslovakia

[73] Assignee: CKD Praha, obrovy podnik, Prague, Czechoslovakia

[21] Appl. No.: 197,258

[22] Filed: Oct. 15, 1980

Related U.S. Application Data

[63] Continuation-in-part of Ser. No. 935,907, Aug. 23, 1978, abandoned.

[30] Foreign Application Priority Data

Aug. 23, 1977 [CS] Czechoslovakia ............... 5529-77

[51] Int. Cl.³ .......................................... H01L 29/74
[52] U.S. Cl. .................................. 357/38; 357/68
[58] Field of Search ............................ 357/38, 68

[56] References Cited

U.S. PATENT DOCUMENTS

| | | | |
|---|---|---|---|
| 4,060,825 | 11/1977 | Schlegel | 357/38 |
| 4,079,406 | 3/1978 | Burtscher | 357/38 |
| 4,210,924 | 7/1980 | Akabove | 357/38 |

Primary Examiner—Martin H. Edlow
Attorney, Agent, or Firm—Klein & Vibber

[57] ABSTRACT

A multilayer semiconductor element with improved dynamic electric parameters obtained by a suitable geometric arrangement of the control zone and by the use of a controlled emitter.

2 Claims, 3 Drawing Figures

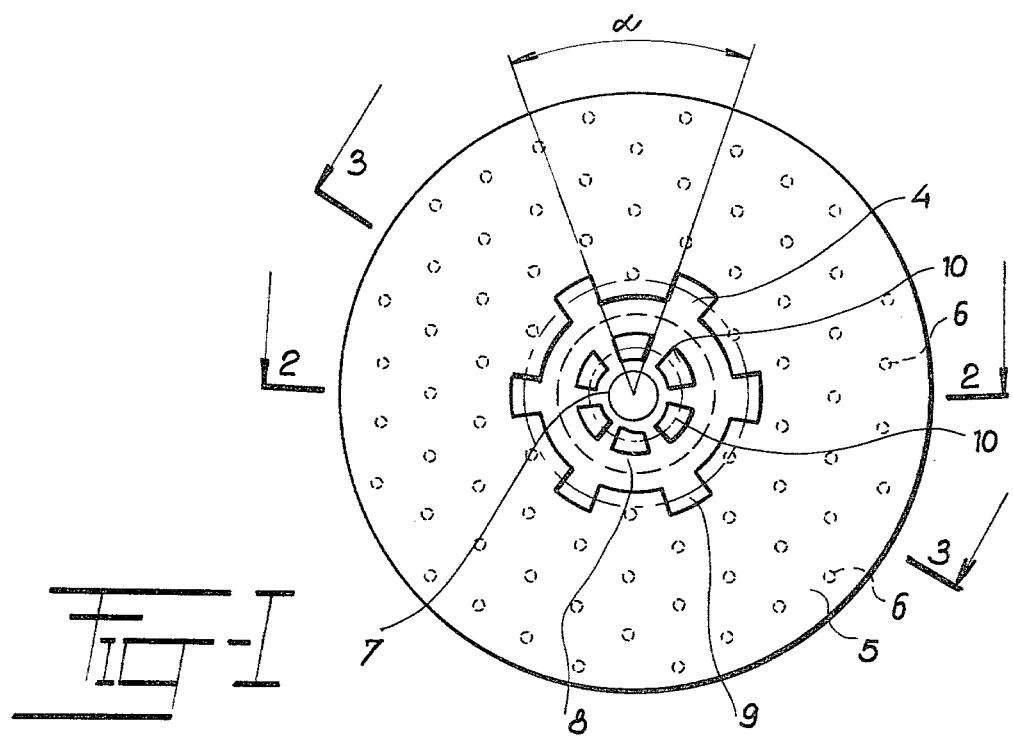
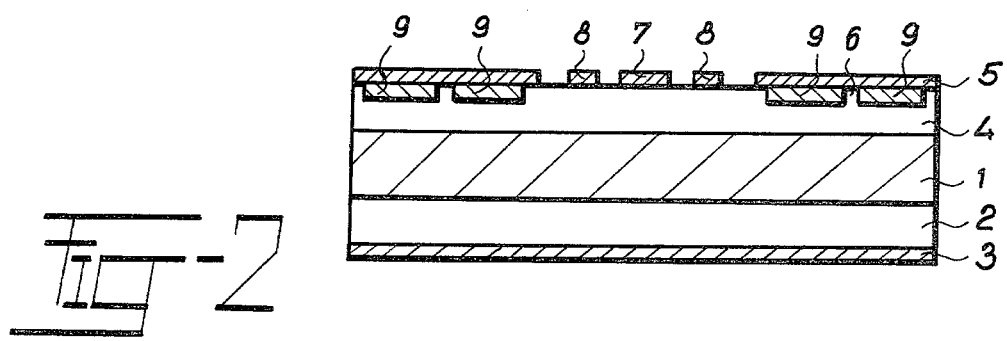
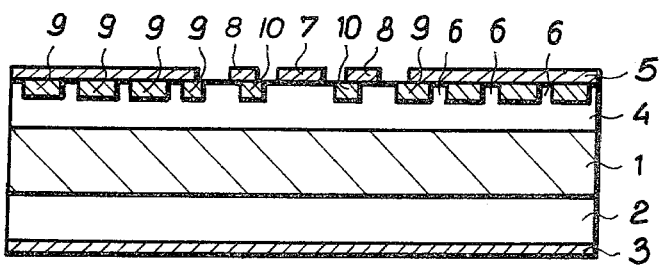
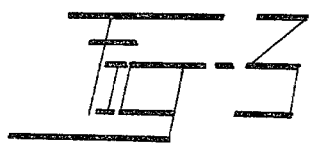

MULTILAYER SEMICONDUCTOR ELEMENT

This application is a continuation-in-part of application Ser. No. 935,907, filed Aug. 23, 1978, now abandoned.

BACKGROUND OF THE INVENTION

The invention has among its objects the provision of a multilayer semiconductor element with improved dynamic electric parameters, while simultaneously maintaining a high level of static parameters, particularly the blocking and reverse voltage and the possibility of sustaining a high current load.

Similar elements of known design use microleaks between the cathode and the second external layer for the improvement of the parameters du/dt of the network. For the improvement of the parameters di/dt and of switching properties, a special arrangement of the control zone is used, for instance an auxiliary emitter layer provided with an auxiliary contact forming an auxiliary structure for cascade switching. In order to reduce the turn-off time, a regulation of the lifetime of minority carriers is used, for instance by diffusion of gold or other components, by electron irradiation, by gamma irradiation and the like.

A drawback of these arrangements is that the individual constructional designs aim at an improvement of one kind of parameters, while other parameters are influenced rather unfavorably. A special design of the control zone of components of known arrangements for instance yields a high value of the parameters di/dt; it does not, however, solve the problem of the turn-off time. In order to achieve a short turn-off time, a substantial reduction of the minority carriers has to be used. This influences adversely the value di/dt, mainly leading to an impairing of the dependence on temperature of the reverse and blocking characteristics of the element, and also leads to a reduction of the possibility of sustaining a high current load. In addition, the achievement of the required concentration profile of generation-recombining admixtures is rather demanding technologically, whether a diffusion of some recombination admixture is used, or recombination centers are formed by radiation.

SUMMARY OF THE INVENTION

It is an object of this invention to eliminate to a high degree the above-described drawbacks of the prior art and to achieve a high level of the dynamic pressure di/dt, du/dt and of the turn-off time, while simultaneously maintaining a high level of the static parameters such as the blocking and reverse voltage and the carrying of a high current load by the suitable geometric arrangement of the control zone with an auxiliary emitter and a zone of the controlled emitter. In accordance with the invention the auxiliary emitter layer is divided into two or more parts which are mutually separated by zones of the second external semiconductor layer. The border of the emitter layer in the direction towards the control electrode is equally divided into a number of parts equal to those of the auxiliary emitter layer by zones of the second external semiconductor layer reaching up to below the contact of the second main electrode. The geometric arrangements between the second external semiconductor layer and the second main electrode are the same, at all parts of the surface of the emitter layer being determined from the surface of the emitter layer by circles with the center at the center of each part of the thus divided border of the emitter layer, and with a radius at least equal to a 1.5 times the distance to centers of the nearest two microleaks.

DESCRIPTION OF THE DRAWING

An exemplary structure according to this invention is shown in the attached drawing wherein:

FIG. 1 is a diagrammatic top view of the arrangement;

FIG. 2 is a vertical section view taken along a plane indicated in FIG. 1 by the line 2—2, and FIG. 3 is a vertical sectional view taken along a plane indicated in FIG. 1 by the line 3—3.

DESCRIPTION OF THE PREFERRED EMBODIMENT

The illustrative embodiment according to this invention comprises a layer of a fundamental semiconductor material, a first main electrode 3, and a second main electrode 5. Microleaks 6 are provided between the second external layer 4 and the second main electrode 5. There is furthermore a central contact 7 of the main control electrode 5, an auxiliary contact 8 connecting an auxiliary emitter layer 10 with the second external layer 4, and an emitter layer 9. The auxiliary emitter layer 10 is of the same type of conductivity as the layer 1 of the fundamental semiconductor material.

An auxiliary contact is in contact 8 with a part of the auxiliary emitter layer 10 on the second external semiconductor layer 4 and also with this layer, there being a control electrode 7 on the second external semiconductor layer 4. The auxiliary contact 8 is provided between the second main electrode 5 and the control electrode 7, the auxiliary emitter layer 10 being situated between the control electrode 7 and the border of the emitter layer 9. The emitter layer 9 is in contact with the second main electrode 5 with the exception of the border part near the control electrode 7, so that the auxiliary emitter layer 10 is in contact with the auxiliary contact 8.

The auxiliary emitter layer is divided into at least two parts mutually separated by zones of the external semiconductor layer, the border of the emitter layer in the direction toward the control electrode being separated by zones of the second external semiconductor layer, which reach up to contact the second main electrode in a number of parts equal to those of the auxiliary emitter layer. The geometric configuration of the distribution of the microleaks between the second external semiconductor layer and the second main electrode is the same in all parts of the surface of the emitter layer. Such geometric configuration is determined from the surface of the emitter layer by circles with centers at the center of each part of the thus divided border of the emitter layer, said circles having a radius equal to at least 1.5 times the distance between the centers of nearest two microleaks.

From the point of view of the possibility of a simple design of the structure according to the required level of dynamic parameters, and from the point of view of an optimum circuit for currents from the surface of the system, the following arrangement of components is advantageous. In such arrangements individual parts of the auxiliary emitter layer and the individual parts of the circuit of the emitter layer in direction towards the control electrode are determined by equal sectors of a circle having an angle $\alpha$ between 18° and 55°, and wherein the arrangement of circular microleaks on the surface of the emitter layer forms a network of equilateral triangles and the geometric factor k of which is determined by the following equation $$k = \frac{d^2}{16}\left\{\left(\frac{2r}{d}\right)^2 - \left[\ln\left(\frac{2r}{d}\right)^2 + 1\right]\right\}$$

wherein
r is the radius of the microleaks, and
d is the distance between the centers of each of two most adjacent microleaks of the network.

k lies within the limits of $9 \times 10^{-3}$ mm$^2$ to $1.8 \times 10^{-1}$ mm$^2$.

According to this invention while maintaining requirements for di/dt and for static parameters, the uniform and efficient removal of capacitance currents and of currents due to residual loads from the whole structure at turn-off process is secured, and an unwelcomed switching-on of the structure due to these currents is prevented under any conditons of the parameter du/dt and that of the turn-off time.

A substantial advantage over other methods of solution of the turn-off time is the possibility of the simple technological production of the arrangement according to this invention. The higher technical effect of the arrangement according to this invention is achieved by a new geometric arrangement of the control zone and the controlled emitter; this represents a technology no more complicated than those used for making presently known thyristors.

As a concrete realization of the invention, the thyristor may be manufactured by some commonly known technology, for instance by diffusion, where by a commonly known photo-lithographic technique the surface configuration of the emitter layer is formed so that microleaks between the second external layer 4 and the second main electrode 5 form a network of equilateral triangles, the geometric factor k in the above equation being within limits of $9 \times 10^{-3}$ mm$^2$ up to $1.8 \times 10^{-1}$ mm$^2$, and the auxiliary emitter layer 10 and the border of the emitter layer are divided into six equal parts, the separating lines of which are six sectors of a circle, the central angle $\alpha$ of the sectors lying between 18° and 55°. The arrangement of contacts from the side of the emitter layer is also achieved by a commonly known photo-lithographic process.

The invention is particularly advantageous for the manufacture of fast-acting thyristors with high requirememnts as to the level of the dynamic parameters di/dt, du/dt, and of the turn-off time in combination with a high level of blocking and reverse voltages. The invention also permits a substantial simplification of technology for all thyristors having a requirement for a short turn-off time, since it can replace the relatively complicated technology for reduction of the lifetime of carriers for instance by the diffusion of gold or by radiation.

Although the invention is illustrated and described with reference to one preferred embodiment thereof, it is to be expressly understood that it is in no way limited to the disclosure of such a preferred embodiment, but is capable of numerous modifications within the scope of the appended claims.

We claim:
1. A multilayer semiconductor element comprising a layer of a fundamental semiconductor material, a first and a second external semiconductor layer with a type of electrical conductivity opposite from that of the layer of the fundamental semiconductor material, the layer of fundamental semiconductor material being situated between said two external semiconductor layers, an emitter layer and an auxiliary emitter layer of the same type of conductivity as the layer of the fundamental semiconductor material being provided on the second external semiconductor layer, a first main electrode on the first external semiconductor layer, a second main electrode disposed above and in contact with the emitter layer on the second external semiconductor layer and also in contact with the second external semiconductor layer in a number of places and forming so-called microleaks, an auxiliary contact in contact with a part of the auxiliary emitter layer on the second external semiconductor layer and also in contact with the second external semiconductor layer, a central control electrode on the second external semiconductor layer, said auxiliary contact being provided between the second main electrode and the control electrode, the auxiliary emitter layer being situated between the control electrode and the peripheral edge portion of the emitter layer, the emitter layer being in contact with the second main electrode with the exception of the peripheral edge portion of the second main electrode near the control electrode, whereby the auxiliary emitter layer is in contact with the auxiliary contact, the auxiliary emitter layer being divided into at least two parts mutually separated by zones of the second external semiconductor layer, the peripheral edge portion of the emitter layer in the direction toward the control electrode being equally separated by zones of the second external semiconductor layer, said zones reaching up to contact the second main electrode and being equal in number to the parts of the auxiliary emitter layer, the geometric arrangements between the second external semiconductor layer and the second main electrode being the same in all parts of the surface of the emitter layer, the microleaks lying on circles with centers at the center of each part of the thus divided border of the emitter layer, said circles, having a radius equal to at least 1.5 times the distance of the centers of each nearest two microleaks from each other.

2. A multilayer semiconductor element as claimed in claim 1, wherein the microleaks are circular and the individual parts of the emitter layer and the individual parts of the border of the emitter layer in the direction toward the control electrode are determined by equal sectors of a circle with an angle between 18° and 55°, and the center of the circular microleaks on the surface of the emitter layer are disposed on a network of equilateral triangles with a geometric factor k which is given by the equation $$k = \frac{d^2}{16}\left\{\left(\frac{2r}{d}\right)^2 - \left[\ln\left(\frac{2r}{d}\right)^2 + 1\right]\right\}$$

where
r is the radius of the microleak
d the distance of centers of two microleaks of the network, the magnitude of k being between $9.10^{-3}$ mm$^2$ and $1.8.10^{-1}$ mm$^2$.

* * * * *